(12) United States Patent
Hellstrom et al.

(10) Patent No.: US 8,513,804 B2
(45) Date of Patent: Aug. 20, 2013

(54) NANOTUBE-BASED ELECTRODES

(75) Inventors: Sondra Hellstrom, Stanford, CA (US); Zhenan Bao, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 284 days.

(21) Appl. No.: 12/759,534

(22) Filed: Apr. 13, 2010

(65) Prior Publication Data

US 2011/0248401 A1    Oct. 13, 2011

(51) Int. Cl.
*H01L 23/48* (2006.01)
*H01L 21/441* (2006.01)
*B05D 5/12* (2006.01)

(52) U.S. Cl.
USPC .............. 257/741; 257/E23.01; 257/E21.477; 977/742; 427/58

(58) Field of Classification Search
USPC ............ 257/741, E23.01, E21.477; 977/742; 427/58
See application file for complete search history.

(56) References Cited

U.S. PATENT DOCUMENTS

| | | | |
|---|---|---|---|
| 7,683,359 B2 | 3/2010 | Green | |
| 7,972,031 B2 * | 7/2011 | Ray et al. | 362/249.02 |
| 2003/0089899 A1 | 5/2003 | Lieber et al. | |
| 2008/0008844 A1 | 1/2008 | Bettge et al. | |
| 2008/0044732 A1 | 2/2008 | Salot et al. | |
| 2008/0297453 A1 * | 12/2008 | Ray et al. | 345/82 |
| 2010/0255323 A1 * | 10/2010 | Nakamura et al. | 428/457 |
| 2010/0330358 A1 * | 12/2010 | Hashimoto | 428/323 |
| 2012/0018301 A1 * | 1/2012 | Joshi et al. | 204/403.14 |
| 2012/0058255 A1 * | 3/2012 | Gan et al. | 427/113 |
| 2012/0059120 A1 * | 3/2012 | Takahashi et al. | 524/612 |
| 2012/0164797 A1 * | 6/2012 | Lowenthal et al. | 438/127 |
| 2012/0178194 A1 * | 7/2012 | Ray et al. | 438/29 |
| 2012/0178195 A1 * | 7/2012 | Ray et al. | 438/29 |

OTHER PUBLICATIONS

Westwater, J. et al., *Growth of silicon nanowires via gold/silane vapor-liquid-solid reaction*, J. Vac. Sci. Technol. B 15(3,) 554-557 (May/Jun. 1997).
Kataura, H. et al., *Optical Properties of Single-Wall Carbon Nanotubes*, Synth. Met., 103, 2555-2558. (1999).
Fuhrer, M. S et al., *Crossed Nanotube Junctions*, Science, 288, 494-497 (2008).
Hilt, O., et al., *Localized and Delocalized Charge Transport in Single-Wall Carbon-Nanotube Mats*, arXiv:cond-mat/0001222v1, Phys. Rev. B, 61, R5129-R5132 (2000).
Hone, J. et al, *Electrical and Thermal Transport Properties of Magnetically Aligned Single Wall Carbon Nanotube Films*, Appl. Phys. Lett 77, 666-668 (2000).
Chen, Z. et al. *A Mechanical Assessment of Flexible Optoelectronic Devices*, Thin Solid Films, 394, 202-206 (2001).
Kymakis, E. et al. *Single-Wall Carbon Nanotube/Conjugated Polymer Photovoltaic Devices*, Appl. Phys. Lett., 80, 112-114 (2002).

(Continued)

*Primary Examiner* — A O Williams

(57) ABSTRACT

Transparent electrodes are manufactured. In accordance with various example embodiments, a transparent electrode is manufactured by generating a solution including a composite material having nanotubes and a conjugated polymer, in which the nanotubes constitute a majority of the composite material by weight. The conjugated polymer is used to disperse the nanotubes in the solution, and the solution is coated onto a substrate to form an electrode including a network of the carbon nanotubes.

17 Claims, 11 Drawing Sheets

(56) References Cited

OTHER PUBLICATIONS

Graetz, J. et al. *Highly Reversible Lithium Storage in Nanostructured Silicon*, Electrochemical and Solid-State Letters, 6 (9) A194-A197 (2003).

Fischer, J. E. et al., *Magnetically Aligned Single Wall Carbon Nanotube Films: Preferred Orientation and Anisotropic Transport Properties*, J. Appl. Phys., 93, 2157-2163 (2003).

Wu, Z. et al., *Transparent, Conductive Carbon Nanotube Films*, Science, 305, 1273-1276 (2004).

Hu, L. et al., *Percolation in Transparent and Conducting Carbon Nanotube Networks*, Nano Lett., 4, 2513-2517 (2004).

Zhang, M. et al., Strong, Transparent, Multifunctional, Carbon Nanotube Sheets, *Science*, 309, 1215-1219 (2005).

*TFT LCD Makers Drive Indium Shortage and Evade It.* III_Vs Rev., 18, 12 (2005).

Dick, K.A. et al., *A new Understanding of AU-Assisted Growth of III-V semiconductor Nanowires*, Advanced Functional Materials, vol. 1,5 pp. 1603-1610 (2005).

Hannon, J. B. et al. *The influence of the surface migration of gold on the growth of silicon nanowires*, Nature vol. 440/2, 69-71 (Mar. 2006).

Kasavajjula, U. et al. *Nano- and bulk-silicon-based insertion anodes for lithium-ion secondary cells*, Journal of Power Sources 163, 1003-1039 (2007).

Briseno et al., *Patterning organic single-crystal transistor arrays*, Nature 444, 913-917 (Dec. 14, 2006).

Dettlaff-Weglikowska, U., *Effect of SOC12 Treatment on Electrical and Mechanical Properties of Single-Wall Carbon Nanotube Networks*, J. Am. Chem. Soc. 127, 5125-5131 (2005).

Geng, J.; Zeng, T., *Influence of Single-Walled Carbon Nanotubes Induced Crystallinity Enhancement and Morphology Change on Polymer Photovoltaic Devices*, J. Am. Chem. Soc., 128, 16827-16833 (2006).

Lee et al., *Linker-free directed assembly of high-performance integrated devices based on nanotubes and nanowires*, Nature Nanotechnology 1, 66-71 (2006).

Wang et al., *Controlling the shape, orientation, and linkage of carbon nanotube features with nano affinity templates*, PNAS, 103 (7) 2026-2031 (2006).

Zhou, Y. et al., *A Method of Printing Carbon Nanotube Thin Films*, Appl. Phys. Lett, 88, 123109-1-123109-3 (2006).

Zhang, D. et al., *Transparent, Conductive, and Flexible Carbon Nanotube Films and Their Application in Organic Light-Emitting Diodes*, Nano Lett., 6, 1880-1886 (2006).

Gonc,alves, G., *Influence of Post-Annealing Temperature on the Properties Exhibited by ITO, IZO and GZO Thin Films*, Thin Solid Films, 515, 8562-8566 (2007).

Parekh, B. B., et al. *Improved Conductivity of Transparent Single-Wall Carbon Nanotube Thin Films via Stable Postdeposition Functionalization*, Appl. Phys. Lett, 90, 121913-1-121913-3 (2007).

Geng, H.-Z. et al., Effect of Acid Treatment on Carbon Nanotube—Based Flexible Transparent Conducting Films, *J. Am. Chem. Soc.*, 129, 7758-7759 (2007).

Kang, M.-G. et al., *Nanoimprinted Semitransparent Metal Electrodes and Their Application in Organic Light-Emitting Diodes*, Adv. Mater., 19, 1391-1396 (2007).

Zimney, E. J. et al., *Correction Factors for 4-Probe Electrical Measurements with Finite Size Electrodes and Material Anisotropy: A Finite Element Study*, Meas. Sci. Technol., 18, 2067-2073 (2007).

Lee, J.-Y. et al. *Solution—Processed Metal Nanowire Mesh Transparent Electrodes*, Nano Lett., 8, 689-692 (2008).

Kim, J.-Y. et al., *Polymer-Dispersed Liquid Crystal Devices Using Highly Conducting Polymers as Electrodes*, Appl. Phys. Lett., 92, 183301-1-188330-3 (2008).

Becerril, H. A. et al., *Evaluation of Solution-Processed Reduced Graphene Oxide Films as Transparent Conductors*, ACS Nano, 2, 463-470 (2008).

Green, A. A. et al, *Colored Semitransparent Conductive Coatings Consisting of Monodisperse Metallic Single-Walled Carbon Nanotubes*, Nano Lett., 8, 1417-1422 (2008).

Blackburn, J. L. et al., *Transparent Conductive Single-Walled Carbon Nanotube Networks with Precisely Tunable Ratios of Semiconducting and Metallic Nanotubes*, ACS Nano, 2, 1266-1274 (2008).

Yanagi, K. et al., Optical and Conductive Characteristics of Metallic Single-Wall Carbon Nanotubes with Three Basic Colors; Cyan, Magenta, and Yellow, Appl. Phys. Express, 1, 034003-1-034003-3 (2008).

Wada, H.; Mori, T., *Solution-processed carbon electrodes for organic field-effect transistors*, Appl. Phys. Lett. 93, p. 213303 (2008).

Gu, H.; Swager, H. M. Free-standing, Conductive, and Transparent Carbon Nanotube Films, *Adv. Mater.*, 20, 4433-4437 (2008).

Geng, H.-Z. et al., *Effect of Carbon Nanotube Types in Fabricating Flexible Transparent Conducting Films*, J. Korean Phys. Soc., vol. 53, No. 2, 979-985 (2008).

Herzer, N. et al., Sample *Target Substrates with Reduced Spot Size for MALDI-TOF Mass Spectrometry Based on Patterned Self-Assembled Monolayers*, Advanced Functional Materials, vol. 19, Issue 17, 2777-2781 (2009).

Barnes, T. M. et al., *Reversibility, Dopant Desorption, and Tunneling in the Temperature-Dependent Conductivity of Type-Separated, Conductive Carbon Nanotube Networks*, ACS Nano, 2, 1968-1976 (2008).

Dan, B. et al. *Continuous and Scalable Fabrication of Transparent Conducting Carbon Nanotube Films*, ACS Nano, 3, 835-843 (2009).

Hellstrom, S. L. et al, *Polymer-assisted direct deposition of uniform carbon nanotube bundle networks for high performance transparent electrodes*, ACS Nano, 3 (6), 1423-1430 (2009).

\* cited by examiner

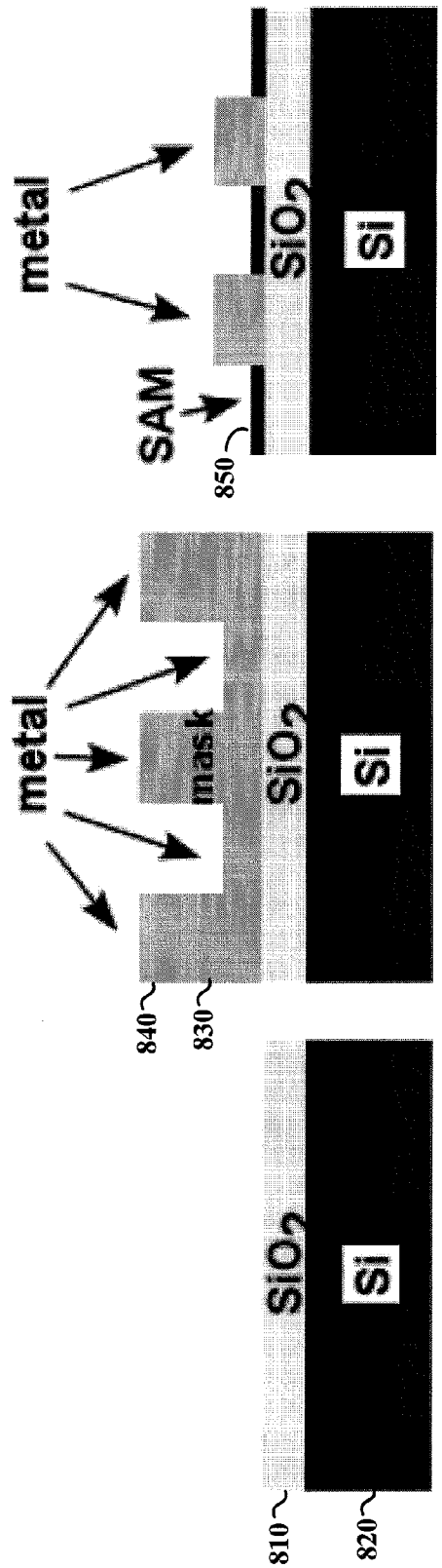

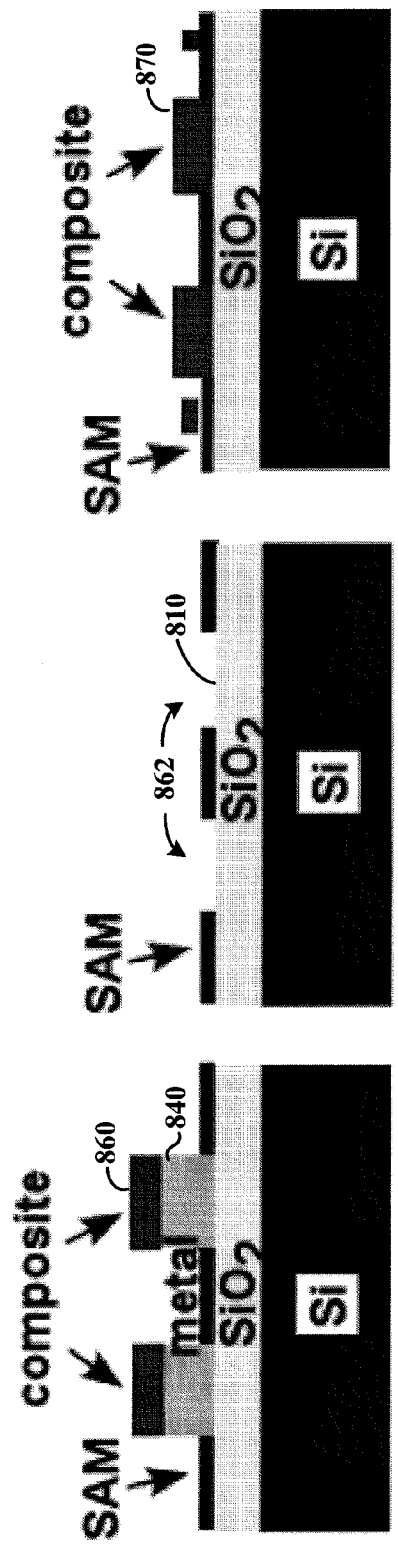

NANOTUBE-BASED ELECTRODES

FIELD

The present invention relates generally to electrodes, and more specifically, to nanotube-based electrodes and related methods.

BACKGROUND

Electrodes have been used for a variety of applications, including interconnects, batteries, transparent devices (transparent electrodes), and supercapacitors. Each of these electrodes is useful in a variety of applications. For example, transparent conducting materials are useful for touch screens, solar cells, and flat panel displays.

A common material used for fabricating such electrodes is indium tin oxide (ITO). However, for low-cost or flexible electronics such as those using organic semiconductors, ITO has undesirable characteristics, such as requiring high-temperature processing steps that are incompatible with plastic substrates, brittleness, and rapidly increasing costs of scarce materials.

Attempts to meet desirable electrode characteristics, such as conductivity and transparency characteristics, for a variety of materials have been limited. For instance, certain electrodes exhibit non-uniform surface coverage on the nanometer scale, may also require lithography for fabrication, and nanowire electrodes may suffer from high roughness as the nanowires can stack hundreds of nanometers high. Additionally, surface environmental stability can be of concern with some metals and for use with organic active layers. While certain electrodes can have a reduced or absent surface dipole barrier to charge injection, many electrodes exhibit such barriers. In addition, many electrodes do not transmit much visible light when layered thickly enough to be sufficiently conducting. Other electrodes require high-temperature annealing, and can be too resistive for many applications.

Some types of electrodes use carbon nanotubes or a carbon nanotube (CNT) network. However, such networks can experience problems relating to a relatively large inter-tube junction resistance, especially between metallic and semiconducting tubes. Another such problem relates to the deposition of CNT networks, which has been challenging to implement due to inhomogeneous, inefficiently networked films. In addition, applicable methods of deposition may require the use of a large amount of surfactant that needs to be removed, can limit the size of films to the size of the membrane filter, and may involve an undesirable transfer printing step. Such electrodes can be particularly difficult to implement as transparent electrodes.

These and other issues remain as a challenge to a variety of methods, devices and systems that use or benefit from nanotube-based electrodes.

SUMMARY

Various aspects of the present invention are directed to devices, methods and systems involving electrodes that address challenges including those discussed above.

According to an example embodiment, an electrode is manufactured on a substrate. A solution including a composite of nanotubes and a conjugated polymer is generated in which the nanotubes constitute a majority of the composite by weight (relative to the polymer and nanotubes). The conjugated polymer is used to disperse the nanotubes in the solution, and the solution is coated on to the substrate to form an electrode including a network of carbon nanotubes.

In connection with another example embodiment, a semiconductor device having carbon nanotube-based electrode regions is manufactured. A solution including nanotubes and a conjugated polymer is generated, in which the nanotubes constitute at least 50% of a non-solvent portion of the solution by weight (e.g., the nanotubes make up at least 50% of a composite of the nanotubes and conjugated polymer). Target regions of a substrate are modified to render the target regions selective to the solution. A carbon nanotube mesh is formed at each of the target regions by coating the solution onto the target regions, using the modified selectivity of the target regions to selectively coat the target regions, relative to other regions of the substrate. The conjugated polymer is used to disperse the nanotubes in the solution, and a network of carbon nanotubes is formed from the solution at each of the target regions. In some implementations, some or all of the conjugated polymer is then removed from the coated solution.

Another example embodiment is directed to a method for manufacturing a semiconductor device having carbon nanotube-based electrode regions. Target regions of a substrate are modified to render the target regions selective to a nanotube solution. A carbon nanotube mesh is formed at each of the target regions by coating the solution onto the target regions, using the modified selectivity of the target regions to selectively coat the target regions, relative to other regions of the substrate. A network of carbon nanotubes is formed from the solution at each of the target regions.

According to another example embodiment, a transparent electrode includes a substrate, a solution on the substrate, and a network of carbon nanotubes, from the solution, that form an electrode. The solution includes a composite of both nanotubes and a conjugated polymer, in which the conjugated polymer is configured to disperse the nanotubes in the solution, the nanotubes constituting a majority of the composite by weight. The solution facilitates the formation of a network of the dispersed carbon nanotubes as the electrode.

The above summary is not intended to describe each embodiment or every implementation of the present disclosure. The figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

FIGS. 3-6 show Raman spectra of various composite films as a function of weight ratio, in accordance with various example embodiments, in which FIG. 3 shows spectra for untreated composite films at wavelengths of 100-1300 $cm^{-1}$, FIG. 4 shows spectra for untreated composite films at wavelengths of 1000-2000 $cm^{-1}$, FIG. 5 shows spectra for treated composite carbon nanotube (CNT) films at wavelengths of 100-1300 $cm^{-1}$, and FIG. 6 shows spectra for treated composite carbon nanotube (CNT) films at wavelengths of 1000-2000 $cm^{-1}$;

FIG. 8 shows a semiconductor device at various stages of manufacture, in accordance with one or more example embodiments;

Figure 1:
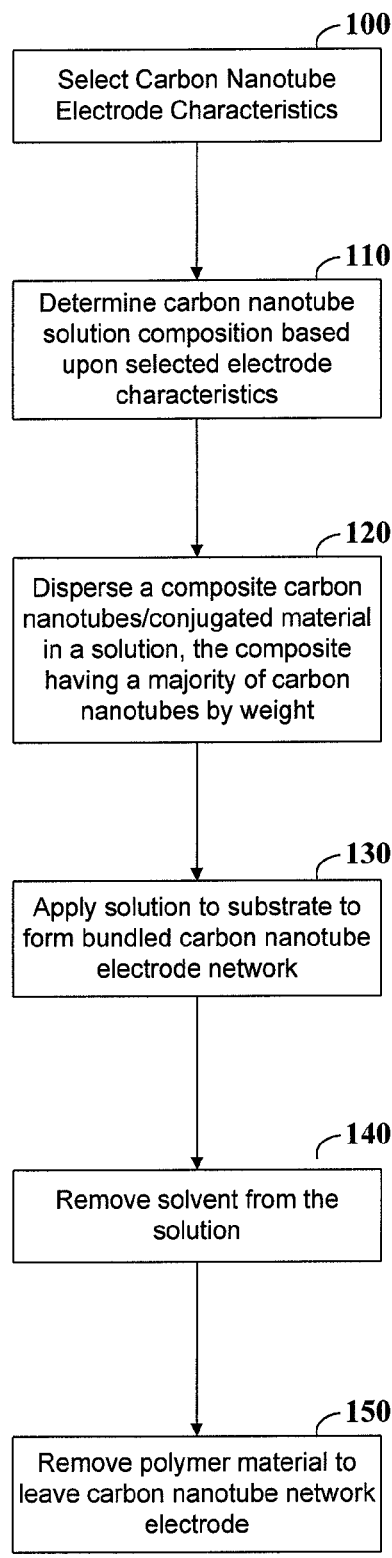
FIG. 1 shows a flow diagram for forming a carbon nanotube-based electrode, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims.

DETAILED DESCRIPTION

The present invention relates to nanotube-based electrodes as described herein. While the present invention is not necessarily limited in these contexts, various aspects of the invention may be appreciated through a discussion of examples using these and other contexts.

According to an example embodiment, a flexible electrode includes a carbon nanotube network formed from a solution including a nanotube-polymer composite, using the polymer to disperse the nanotubes in the solution, as coated onto a supporting substrate such as a glass and/or polyethylene terephthalate (PET) substrate. The composite includes a conjugated polymer that is used to control the dispersion of the nanotubes, as well as a solvent (e.g., trichloroethylene (TCE) or ortho-dichlorobenzene (o-DCB) and/or other solvent material suitable for use with carbon nanotubes and conjugated polymers). The electrode can be implemented for a variety of applications, such as with/as semitransparent/transparent electrodes, batteries, supercapacitors or circuitry (electrodes/interconnects).

The conjugated polymer may include one or more of a variety of types of organic polymers that conduct electricity as a conductor and/or semiconductor, including those that generally exhibit alternating double and single bonds, with delocalized π electrons that facilitate π-stacking of the conjugated polymer upon the nanotubes. Such π-stacking can be used to mitigate the aggregation (bundling) of nanotubes, and facilitate the formation of a relatively uniform nanotube mesh/network. Example conjugated polymers applicable to implementation in a variety of embodiments include regioregular poly(3-hexylthiophene) (rr-P3HT), regioregular poly(3-dodecyl thiophene) (rr-P3DT), regioregular poly(3-alkylthiophene) (e.g., having an alkyl chain between 4 to 16 carbons), polyarylene vinylenes, polyarylene ethynylenes, and MEH-PPV (poly[2-methoxy-5-(2'-ethyl-hexyloxy)-1,4-phenylene vinylene]) polymer used with carbon nanotube suspensions in chloroform.

The solution is applied to the substrate in one or more of a variety of manners, such as via spin-coating, inkjet printing, airbrushing, dip-coating, doctor blading, or drop-casting. The conjugated polymer and/or other portions of the composite may be removed, and the resulting carbon nanotube network can be used in one or more of a variety of devices, such as touch screens, flat panel displays and solar cells (e.g., flexible). For example, the substrate can be treated after the formation of a carbon nanotube film thereupon, to remove or destroy substantially all of the conjugated polymer, and set/improve electrode performance (e.g., by removing at least about 80-90% of the conjugated polymer).

In accordance with various embodiments, the dispersion and application of the carbon nanotubes is carried out using different approaches to select, or tune, the arrangement and composition of carbon nanotubes in the resulting structure. For example, the polymer concentration and solvent type can be controlled to set nanotube bundle size and/or film roughness (e.g., controlling roughness via bundle size, or a range of bundle sizes, as qualitatively observable by atomic force microscopy), to add an additional degree of freedom in tuning film morphology specific applications. In one such application, a conjugated polymer dispersing agent is used with the carbon nanotubes in solution, in which the polymer has less than about a 50% weight ratio with respect to the carbon nanotubes. These and other approaches to effect such tuning may be done independently of bundle density, by controlling the density separately via the volume of dispersion deposited during spin-coating, and to set film thickness. The resulting film thickness can be tested or detected, such as by determining the optical density of the film (e.g., at 550 nm).

In connection with various embodiments, it has been discovered that approaches to nanotube formation resulting in a large bundle size may also result in decreased conductivity. The decreased conductivity may be attributed to large bundles formed due to lack of dispersion as relative, for example, to van der Waals forces between the nanotubes. It can be important to set thresholds based upon device specifications, understanding that while additional carbon nanotubes may be expected to increase conductivity, this may not occur. Accordingly, as the weight ratio of carbon nanotubes relative to conjugated polymer increases, with the formation of such larger bundles, dispersion may be less effective. Consequently, resulting films may exhibit an undesirably large bundle size, and lower than desirable conductivity. As the weight ratio of carbon nanotubes decreases, fewer nanotubes are present and, in some applications, effectively results in a lower conductivity as well, relative to the use of higher weight ratios of carbon nanotubes. In this context, various embodiments are directed to forming a network or mesh of carbon nanotubes using a solution having a weight ratio of carbon nanotubes to conjugated polymer that is at least about 50%, but not so large such that undesirably large bundles are formed (e.g., reducing conductivity).

Some embodiments involve the selection of a weight ratio of carbon nanotubes to conjugated polymer, relative to desired film parameters such as transmittance and conductivity. For example, for a high-end capacitive touch screen device in which video or other image viewing is desired, high transmittance is important to ensure video quality, yet a certain level of conductivity is needed to facilitate touch applications. In such applications, the weight ratio of carbon nanotubes to conjugated polymer can be selected to achieve desired conductivity, such as by using a composite of at least 50% carbon nanotubes by weight while ensuring that undesirably large (and poorly conductive) nanotube bundles are not formed. This selection may be carried out using, for example, an iterative procedure in which different weight ratios of carbon nanotubes to conjugated polymer are used to set, or optimize, the resulting structure. A similar approach may be implemented with a lookup table of known results. For applications in which transmittance is not as important, such as a low-end touch screen having limited display complexity, a weight ratio of carbon nanotubes to conjugated polymer can be set to achieve a heightened conductivity, while maintaining a lower level of transmittance (e.g., optimizing conductivity for a given transmittance). These parameters can be set by setting respective bundle sizes of the carbon nanotubes, via the weight ratios.

In some implementations, post-coating processes are used to further set characteristics of the resulting film and/or structure. For instance, the nanotubes can be annealed, or chemically treated in a material such as thionyl chloride ($SOCl_2$), to set or tune aspects such as the transparency of the carbon nanotube network and to correspondingly set properties of electrodes formed using the carbon nanotube network. This approach can be used, for example, to reduce absorption of polymers such as P3HT.

In some implementations, resulting film roughness is controlled via one or more of the use of certain solvents such as Trichloroethylene and o-dichlorobenzene, which can be used to produce smaller tubes and less rough films (e.g., relative to chloroform). Certain implementations involve adding higher concentrations of polymer to facilitate smoothness, which can also be done relative to a desired effective conductivity and transmittance, as discussed above (e.g., using nearly over 40%, or nearly 50% by weight of polymer as relative to nanotubes).

In various embodiments, the conjugated polymer is π-stacked upon individual nanotubes in the composite, to mitigate aggregation of nanotubes (e.g., due to van der Waals forces) such as by limiting the size and/or the regional density of bundles of carbon nanotubes aggregated together. In many applications, the conjugated polymer is used at less than about 50% weight ratio with nanotubes in a composite to limit the bundle size of nanotubes to less than 100 nm. Other applications involve using such a conjugated polymer to limit the bundle size to less than 40 nm. In these contexts and as relevant to various example embodiments, such bundles correspond to bundles of nanotubes that may be visible as a plurality of intertwined nanotubes under a 50× microscope objective. Such bundles may exhibit nanotube density and intertwining that render the region at the bundle substantially opaque (e.g., the bundle transmits less than about 50% of incident light, and in some implementations, transmits less than about 25% of incident light). These and/or other embodiments may similarly involve forming a nanotube network in which regions, having a highest relative nanotube density (e.g., as compared to other regions on a substrate), are limited in diameter to less than about 100 nm and, in some applications, to less than about 40 nm.

In many embodiments, the resulting carbon nanotube film formed using a solvent-based approach as discussed above includes large tube bundles. In connection with these embodiments, it has been discovered that films having such large bundles (e.g., greater than about 40 nm in diameter, or between about 40 nm and 100 nm in diameter), can exhibit desirable electrode performance. Performance characteristics for such electrodes are exemplified in the following discussion, and shown in figures, such as in FIGS. 2-7 and 9-12.

Turning now to the Figures, FIG. 1 shows a flow diagram for forming a carbon nanotube-based electrode, according to another example embodiment of the present invention. At block 100, carbon nanotube electrode characteristics, such as transparency and conductivity, are selected. At block 110, the composition is determined for a carbon nanotube/polymer composite and related solution which to use in forming the carbon nanotube electrode having characteristics as selected at block 100. For instance, where a certain transmittance is desired, characteristics of a composite relating to one or more of nanotube to polymer ratio, other solution components, volume of solution/polymer content, or type of solvent or polymer can be set to achieve the transmittance. This approach may involve, for example, using a lookup table, algorithm or other approach to determine such characteristics. These characteristics may be further determined based upon expected post-formation treatments that may affect the transmittance and/or other properties of the electrode, effectively working backwards from desired characteristics of a resulting electrode to set manufacturing and composition characteristics predicted to achieve that result.

At block 120, carbon nanotubes and a conjugated polymer are dispersed in a solution, in accordance with the composition determined at block 110. The conjugated polymer is used to disperse the nanotubes in the solution, with the nanotube/polymer composite having a majority of carbon nanotubes by weight. In this context and as consistent with other embodiments herein, the weight ratio refers to the nanotube/polymer ratio, with solvent used in the solution not considered as part of the composite weight. The solution is applied to a substrate at block 130, such as by spin-coating or other approaches as discussed above, and the applied solution is used to form a bundled carbon nanotube electrode network. At block 140, solvent in the solution is removed, such as by evaporation or spinning.

In some embodiments, some or all of the polymer is removed at block 150, such as by washing. Stray composite may also be removed by brief sonication. The carbon nanotube electrode network is left behind and forms the electrode. In some implementations, the resulting network is treated to dope the nanotubes, dope the conjugated polymer, or to further remove remaining conjugated polymer from the network.

In many embodiments, the conjugated polymer is used to disperse the nanotubes at block 120 to set the transmittance (e.g., as selected at block 100), by dispersing the nanotubes across a substrate or regions of a substrate in a manner that ensures relatively uniform transmittance. These applications may, for example, include setting a transmittance at 50%, 60%, 85% or higher, to suit various applications ranging from those requiring/benefitting from relatively low transmittances (e.g., for shielding), to higher transmittances in devices such as flat-panel displays or solar cells. Accordingly, various implementations involve setting a transmittance to produce a carbon nanotube film for use in such applications, using the conjugated polymer to disperse the nanotubes in a manner that facilitates the desired transmittance.

In some embodiments, carbon nanotubes or nanotube bundles are radially aligned on a substrate surface as part of a spin-coating process. For instance, nanotube bundle densities can be set sufficiently low such that the tubes are touching the surface of the substrate directly, to facilitate the radial alignment. As the film thickness increases, the consistency of observed alignment decreases; as such, the thickness of the film can be set to control the degree of alignment, and to accordingly set characteristics of the spin-coated films.

The nanotube composite network morphology (e.g., of rr-P3HT:CNT films) can be set based upon relative weight ratios. For example, as the rr-P3HT concentration is increased from none to 1:15 to 1:5, the proportion of single tubes and small bundles (diameter less than about 5 nm) relative to all the observable bundles also increases, and the presence of visible bundle aggregates both in solution and on substrate diminishes. Increases in absorbance can be used to identify the presence of conjugated polymer (e.g., in the 350-650 nm wavelength range), along with broad nanotube M1 and S2 transitions. In connection with these embodiments, it has been discovered that, for initial polymer weight ratios of 1:5 or smaller in rr-P3HT:CNT composite films, the decrease in transmittance due to the explicit presence of the polymer is 2% or less; for polymer weight ratios of about 1:1, the polymer presence is more substantial.

Figure 2:
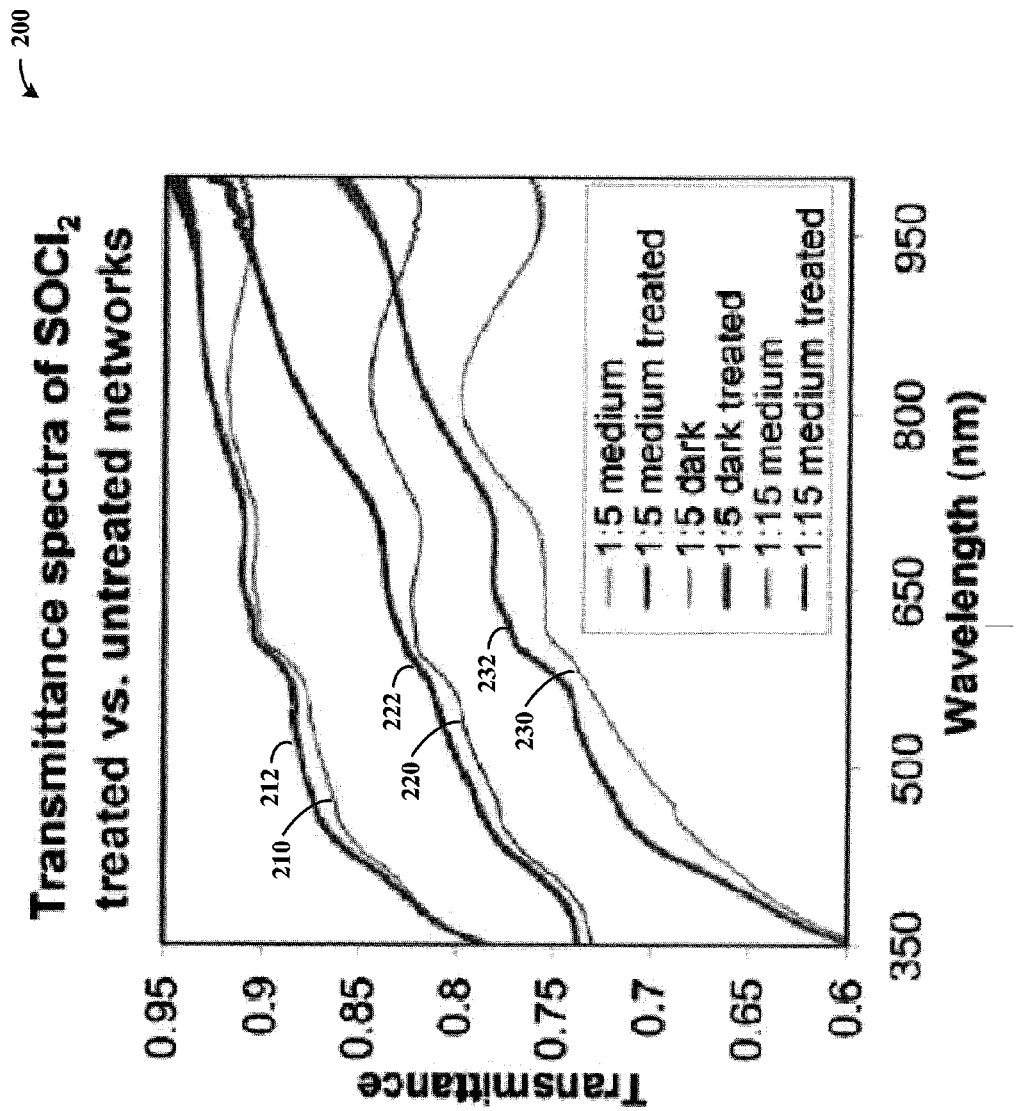
FIG. 2 shows exemplary plots of transmittance values over a wavelength range for films, in accordance with one or more example embodiments.

As consistent with the above, FIG. 2 shows exemplary plots of transmittance values over a wavelength range for films that are treated in accordance with one or more embodiments as described herein. Plots 210 and 212 respectively show transmittance values for medium untreated and treated carbon nanotube films at a 1:5 polymer weight ratio. Plots 220 and 222 respectively show transmittance values for dark (relatively thicker) untreated and treated carbon nanotube films at a 1:5 polymer weight ratio. Plots 230 and 232 respectively show transmittance values for medium untreated and treated carbon nanotube films at a 1:15 polymer weight ratio.

Figure 3:
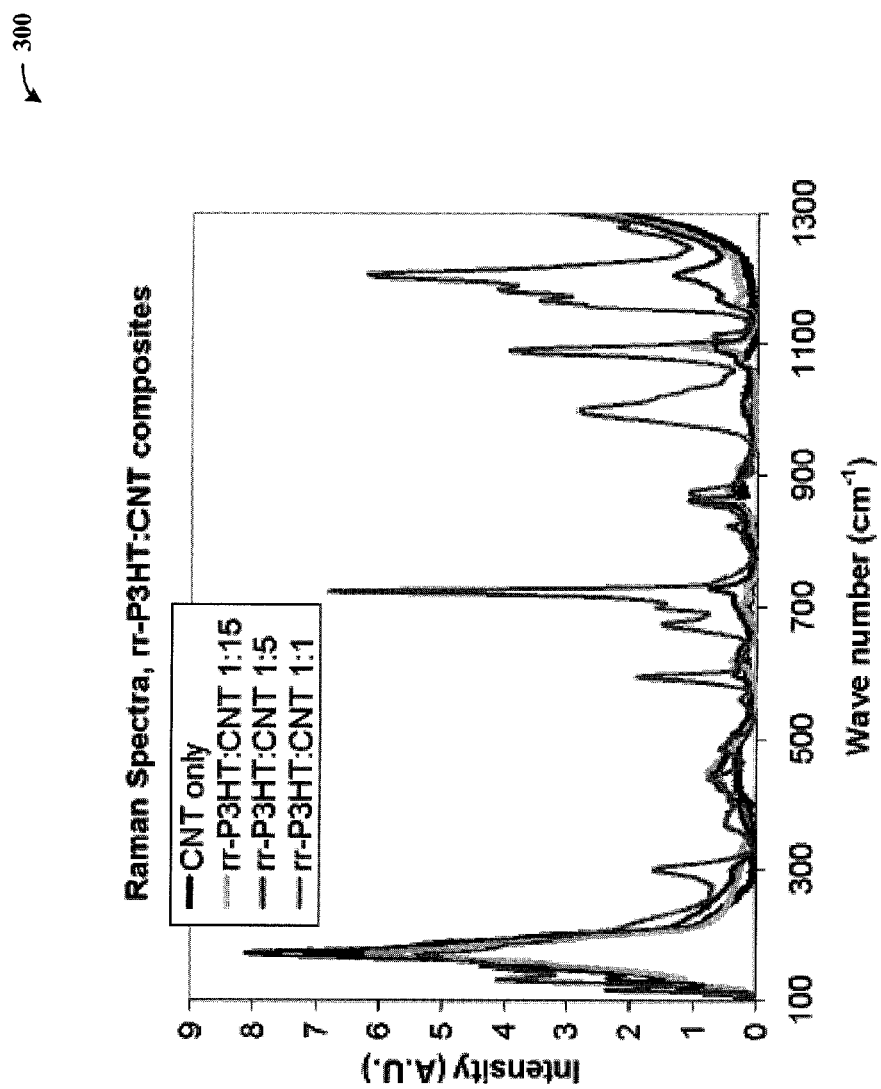
Figure 4:
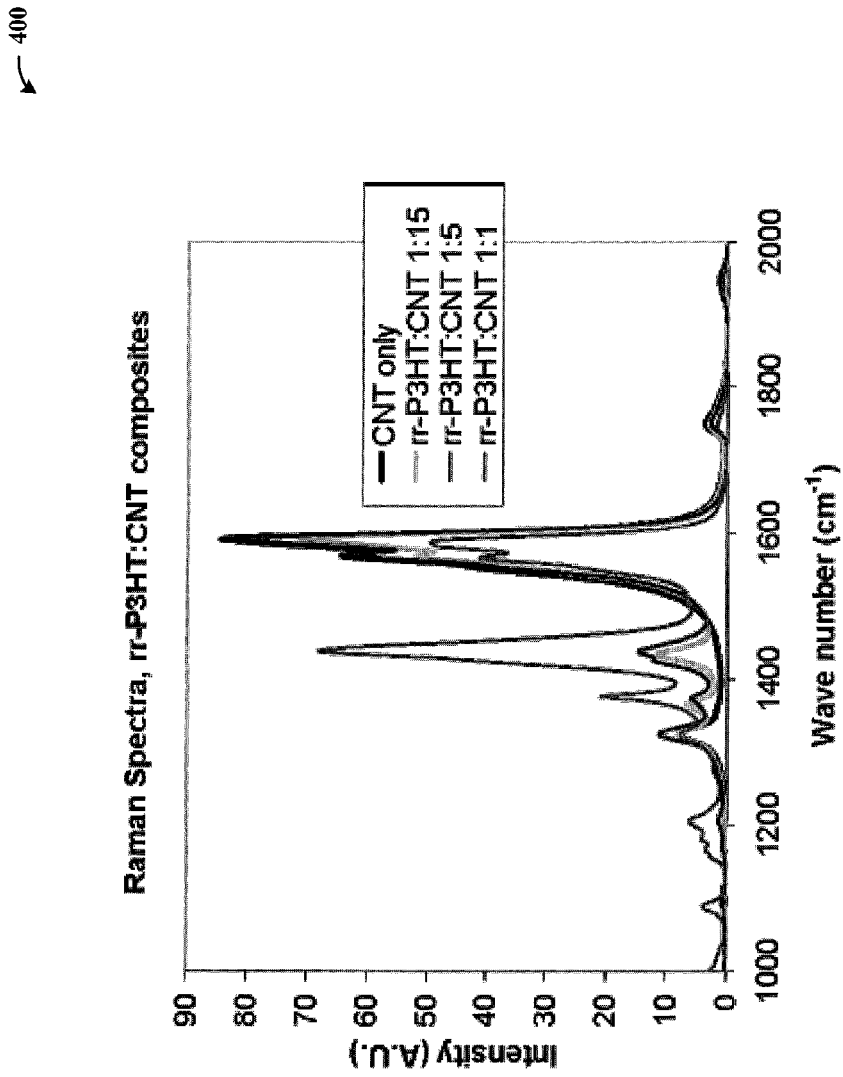
Figure 5:
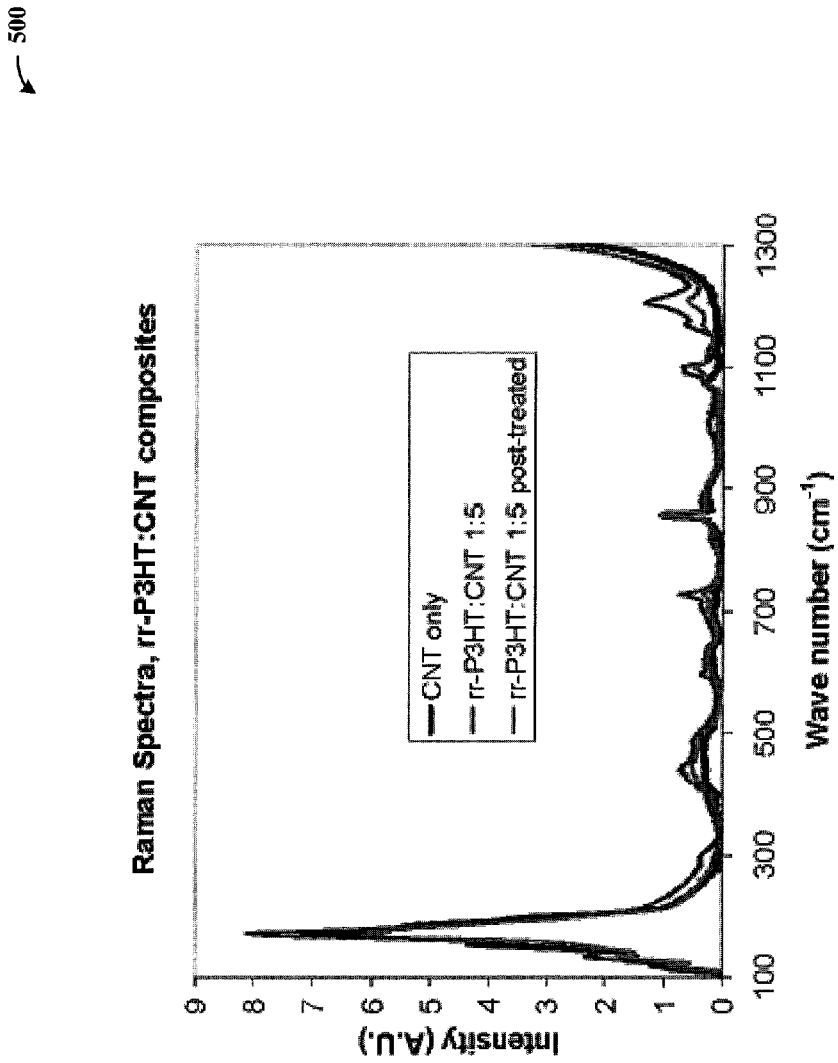
Figure 6:
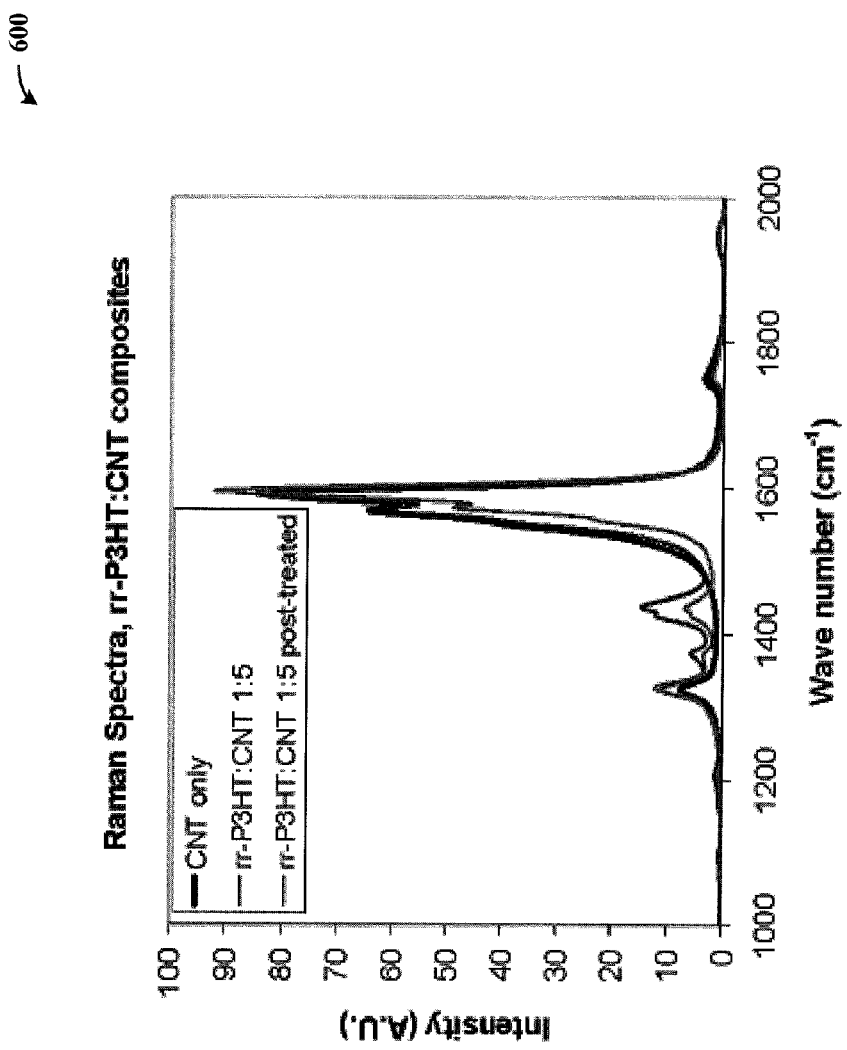

FIGS. 3-6 show Raman spectra of various composite films as a function of weight ratio (e.g., nanotube-polymer ratio), in accordance with various example embodiments. FIGS. 3 and 4 show spectra for untreated composite films respectively at wavelengths of 100-1300 cm$^{-1}$ and 1000-2000 cm$^{-1}$, and FIGS. 5 and 6 show spectra for treated composite carbon nanotube (CNT) films, also respectively at wavelengths of 100-1300 cm$^{-1}$ and 1000-2000 cm$^{-1}$. Beginning with FIGS. 3 and 4, four spectra are shown for a control (CNT only) and solutions including rr-P3HT:CNT respectively at ratios of 1:15, 1:5 and 1:1 in a composite material. In a control with no polymer (CNT only), the radial breathing mode (172 nm), D-band (1328 nm), and G-band (1592 nm) are evident. In the untreated composite films, the more intense P3HT Raman peaks (723, 1000, 1090, 1207, 1378, and 1440 nm) become detectable at a 1:5 rr-P3HT:CNT ratio. More detailed spectral structure is clearly visible in a 1:1 composite. Most peak positions are invariant as the P3HT concentration changes; however, in particular, the $C_{\bar{a}}$-$C_{\bar{a}'}$ ring stretching P3HT mode at approximately 1378 cm$^{-1}$ shifts over 10 cm$^{-1}$ between the 1:15 and 1:1 composites.

Referring to FIGS. 5 and 6, three spectra are shown for a control (CNT only) and solutions of rr-P3HT:CNT at 1:5 ratios for pre-treated and post-treated composites. After treating the composites with SOCl$_2$, the Breit-Wigner-Fano resonance characteristic of metallic tubes around the low-frequency portion of the G-band is suppressed, and the G-band itself is blue-shifted. In connection with these embodiments, it has been discovered that the rr-P3HT peaks are suppressed, which is particularly visible at the most intense P3HT peaks at 1378 and 1440 cm$^{-1}$. As the nanotube D- and G-band intensities do not commensurately decrease, the relative decrease in intensity of these P3HT ring-stretching modes indicates that the SOCl$_2$ is a denaturing or further removal of P3HT from the composite. This denaturing or removal is thus used to improve or otherwise set the electrical performance of the films, which can be carried out irrespective of nanotube doping.

Figure 7:
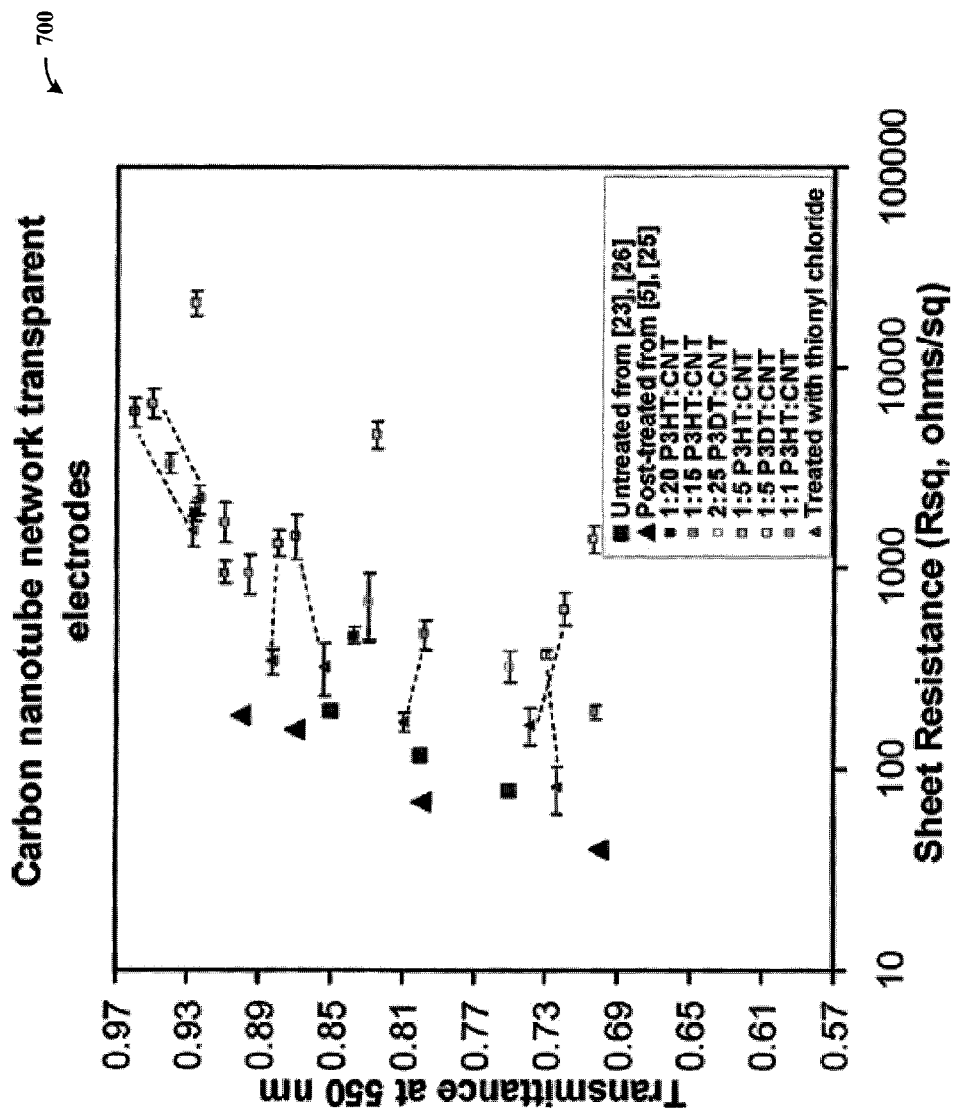
FIG. 7 is a plot showing conductance versus transparency for various ratios of composite materials, both untreated and post-treated, in accordance with other example embodiments.

FIG. 7 is a plot 700 showing conductance versus transparency for various ratios of composite materials, both untreated and post-treated, in accordance with different example embodiments. As discussed above, the transparency and conductance for a particular film can be set relative to one another, based upon such information and to suit various embodiments. These characteristics are set as shown in accordance with such embodiments. Further, various embodiments are directed to using data as shown in selecting solution compositions and treatments to achieve desired conductance/transparency for transparent electrodes and devices employing the same.

In connection with the above discussion and related embodiments involving aspects of FIG. 7, it has been discovered that treating films with SOCl$_2$ has a greater impact on films having higher polymer content. For example, sheet resistance for treated films of 1:5 and 1:15 ratios are respectively enhanced by average factors of about 4 and 2.6, such that the treated 1:5 and 1:15 ratio composite films ultimately have similar performance when tested shortly after treatment. In this context and in connection with various embodiments, SOCl$_2$ (or similar material) can be used to treat films in order to set these and other characteristics of the films, relative to the respective polymer/nanotube ratios used in forming the films. It has also been discovered that treating films with other molecules can more strongly affect films with higher polymer content; in this context, the polymer can be treated alone, to change or set its properties as well.

After SOCl$_2$ treatment, the networks exhibit desirable conductivities and transparencies. For instance, a 1:15 ratio rr-P3HT:CNT composite has a sheet resistance of 170 Ω/sq at 81% transmittance, and a 1:5 ratio rr-P3DT:CNT composite has a sheet resistance of about 80 Ω/sq at 72% transmittance. It should be noted, however, that the measured sheet resistance for a nanotube network varies sensitively depending on the history of the sample and its constituent material and also on the details of how the measurement is made, or the type, position, and geometry of the electrodes, and as such these values are exemplary.

If the thickness of a metallic film is small compared with the wavelength of light, the relationship between its transmittance and sheet resistance in air may be modeled by $$T(\lambda) = \left(1 + \frac{188.5}{R_S} \frac{\sigma_{op}(\lambda)}{\sigma_{dc}}\right)^{-2}$$

where λ is the wavelength of light at which the ties are measured (typically 550 nm) and $\sigma_{op}$ and $\sigma_{dc}$ are the optical and DC conductivities of the material. For general information regarding the modeling of transmittance, and for specific information regarding approaches to such modeling as may be implemented in connection with one or more example embodiments, reference may be made to De, S.; Lyons, P. E.; Sorel, S.; Doherty, E. M.; King, P. J.; Blau, W. J.; Nirmalraj, P. N.; Boland, J. J.; Scardaci, V.; Joimel, J; and Coleman, J.; *Transparent, Flexible, and Highly Conductive Thin Films Based on Polymer-Nanotube Composites, ACS Nano* 2009, 3, 714-720; and to Hu, L.; Hecht, D. S.; Gruner, G., *Percolation in Transparent and Conducting Carbon Nanotube Networks, Nano Lett.* 2004, 4, 2513-2517; both of which are fully incorporated herein by reference.

In the framework of this model, $\sigma_{op}/\sigma_{dc}$ may be used as a figure of merit for the performance of a nanotube network. As relative to measured transmittance and sheet resistance, various desirable treated composite films have an $\sigma_{op}/\sigma_{dc}$ value of about 13 or higher. In accordance with various example embodiments, these approaches are used to predict performance characteristics of various films prior to their formation, and manufacturing characteristics such as solution composition and post-treatment can be set to accordingly achieve the predicted characteristics of the resulting film.

Excess polymer may be removed to set characteristics of and/or benefit network electrodes in several ways, such as by removing interference with conduction between nanotubes, and removing a substance that absorbs at wavelengths of about 550 nm. In these contexts, various embodiments are directed to using a material such as $SOCl_2$ or other molecules that are capable of charge transfer to carbon nanotubes and the polymer, such as to remove, dope or destroy such excess polymer, and/or to dope the nanotubes themselves.

In various example embodiments, carbon nanotube/conjugated polymer composites are patterned onto a substrate from solution. In some implementations, carbon nanotube/conjugated polymer composites are deposited with nanotube density gradients and feature resolution set/achieved via differences in characteristics such as wetting and adhesion between these composites and the substrate surface. These differences can be tuned via the surface composition or characteristics, such as by setting characteristics of (e.g., forming and/or modifying) Silicon or glass surfaces with different silanes or by wetting the surface. Such patterned composites can be used as electrodes in high performance organic thin-film transistors of both pentacene and C60, with on/off ratios of more than $10^5$, and bottom contact mobilities of greater than about 0.5 and 1 $cm^2/V \cdot s$ respectively. In these embodiments, the pentacene can be layered on the patterned electrodes, such as by vacuum sublimation.

For general information regarding wetting approaches, and for specific information regarding approaches to selective wetting that may be implemented in connection with one or more example embodiments, reference may be made to H. Wada, T. Mori, *Solution-processed carbon electrodes for organic field-effect transistors*, Appl. Phys. Lett. 93, page 213303 (2008), which are fully incorporated herein by reference.

FIG. 8 shows a device having SWNT and polymer:SWNT composite electrodes at various stages of manufacture, in accordance with one or more example embodiments. The electrodes are patterned via selective surface functionalization, by masking areas of a $Si/SiO_2$ wafer with thermally-evaporated Al deposited through a shadow mask, prior to exposing the wafer to silane, in accordance with a particular example embodiment. Octadecyltrimethoxysilane (OTMS) is used for its hydrophobic quality, its low interaction energy with carbon nanotubes, and its tendency to improve transistor performance as a gate dielectric modification.

Beginning with FIG. 8A, a $SiO_2$ layer 810 is formed on a silicon substrate 820. At FIG. 8B, a shadow mask material 830 has been pre-patterned to expose portions of the $SiO_2$, and a metal layer 840 (e.g., thermally-evaporated Aluminum) has been formed on the mask and exposed portions of $SiO_2$. At FIG. 8C, metal on the remaining mask layer has been removed, as has the mask layer itself (e.g., by thermal evaporation using a shadow mask), leaving behind the metal layer 840 patterned on the $SiO_2$. The wafer has also been exposed to OTMS to form a self-assembled monolayer (SAM) 850 on the exposed $SiO_2$ layer 810.

After FIG. 8C, the process proceeds in different manners, depending upon the application. In one embodiment, a solution including a polymer:SWNT composite 860 is deposited upon the metal layer 840 as shown in FIG. 8D. The deposited solution can then be processed, such as discussed above, to remove solvent and polymer, leaving SWNTs behind.

In another embodiment, following silane treatment as shown in FIG. 8C, remaining aluminum 840 is etched or otherwise removed, such as by immersing the sample in a standard etchant (16:2:1:1 H3PO4:water:acetic acid:HNO3 by volume) at 40° C., as shown in FIG. 8E in which the $SiO_2$ layer 810 is again exposed at regions 862. The device as so modified can then be re-cleaned (e.g., in toluene and ethanol), and a composite polymer:SWNT solution is deposited as shown in FIG. 8F, on the exposed $SiO_2$ layer 810 and on the SAM 850.

A number of variations to the above-described approaches may be implemented in connection with other embodiments. For example, patterned alkylsilane modification approaches such as those involving microcontact printing or selective etching through a mask can be implemented to form the structures as shown (see, e.g., *Patterning organic single-crystal transistor arrays*, Briseno et al., Nature 444, 913-917 (14 Dec. 2006) and *Sample Target Substrates with Reduced Spot Size for MALDI-TOF Mass Spectrometry Based on Patterned Self-Assembled Monolayers Nicole Herzer*, Eckardt et al., Advanced Functional Materials Early View, 10.1002/adfm.200801896, which are fully incorporated herein by reference).

The electrode formation sequences shown in FIG. 8 can be carried out using different approaches, such as by using different materials or other related processes. For instance, different metal electrodes can be used, such as for selectively modifying Au electrodes with pristine SWNTs or polymer: SWNT composites, by depositing electrodes of a desired metal via shadow mask, and forgoing the etch step. In addition, exposed regions of the $SiO_2$ layer 810 can be modified with a different silane-based material, such as Aminopropyltriethoxy Silane (APTES), such as to facilitate a strong affinity for nanotubes relative to bare $SiO_2$.

The polymer:SWNT composite solution, as applied to form the device as shown in FIG. 8D, is prepared using one or more of a variety of approaches that may include those discussed above or others. For example, a solution can be prepared using 1:1 weight ratio P3HT:SWNT in trichloroethylene, 1:1 P3HT:SWNT in chloroform, 1:5 P3HT:SWNT in chloroform, and 1:1 MEH-PPV:SWNT in o-DCB. For higher weight ratios of polymer:SWNT, spin-coated composites are confined to regions of the surface that are not covered with OTMS. For lower weight ratio composites with larger bundles, such as for pristine tubes or for drop cast films, the initial coating can be imperfect, and devices on a substrate may have bundles extending into or bridging the channel. Due to the difference in adhesion of SWNT to the different surfaces, itinerant tubes can be removed by gentle mechanical application, such as by applying brief (5-20 seconds) ultrasonication at 250 W power in CHCl3, and/or applying and removing a flat piece of cured polydimethylsiloxane elastomer to the surface.

In addition, the thickness and density of SWNT films can be set accordingly. For instance, features having dimensions as small as 3 microns over areas of more than 3 $cm^2$ can be produced. The tube density on a given substrate is adjustable by changing the amount of material deposited, and can be varied based upon the electrode shape and size on a substrate (e.g., for spin-coated composite samples), using selective wetting to set the density. Tube densities can be set between 0 and hundreds of tubes per micron, within a few hundred nanometers. In addition, the nanotube bundles at the electrode edge can be formed in a manner that is predominantly not perpendicular to that edge, which can be used to set the electric field of the resulting device.

In some embodiments, polycrystalline organic semiconductor thin films are formed on the nanotube composite films, using the underlying nanotube film to set the morphology of the polycrystalline organic semiconductor thin films. This morphology control may, for example, be used to set electrode-semiconductor-dielectric interface characteristics for certain applications, such as for bottom-contact organic transistors.

Such semiconductor films can be grown using a vacuum sublimation technique, such as with substrate temperatures of 60 degrees in the case of pentacene and 80 degrees for $C_{60}$. Initially, pentacene selectively nucleates and grows on the carbon nanotube bundles, in discrete grains that may lie flat on, and perpendicular to the axis of, the nanotubes in the underlying layer. As the pentacene thickness is increased, a film is deposited on the $SiO_2$ surrounding the nanotubes, and this film directly abuts the tubes on either side (grains on the tubes can be disconnected from this broader layer).

As with pentacene, $C_{60}$ selectively nucleates and grows on the deposited carbon nanotubes, and can be arranged with no visible discontinuity or boundary edge (e.g., in a 40 nm C60 film at the boundary between OTMS and a pre-patterned polymer:SWNT film, as shown in FIG. 8). While the $C_{60}$ film becomes discontinuous when the roughness of the electrode becomes too great, at the edges where the electrodes are thinner and the charge injection takes place, the semiconductor film appears unbroken.

The electrical performance of thin-film transistors of pentacene and $C_{60}$ using these nanotube-based electrodes can be tailored for various applications. For example, saturation-regime hole mobilities of pentacene devices can be set between about 0.2-0.7 $cm^2/V*s$, and the saturation-regime electron mobilities of $C_{60}$ devices can be set between about 0.6-1.5 $cm^2/V*s$.

Figures 9, 10:
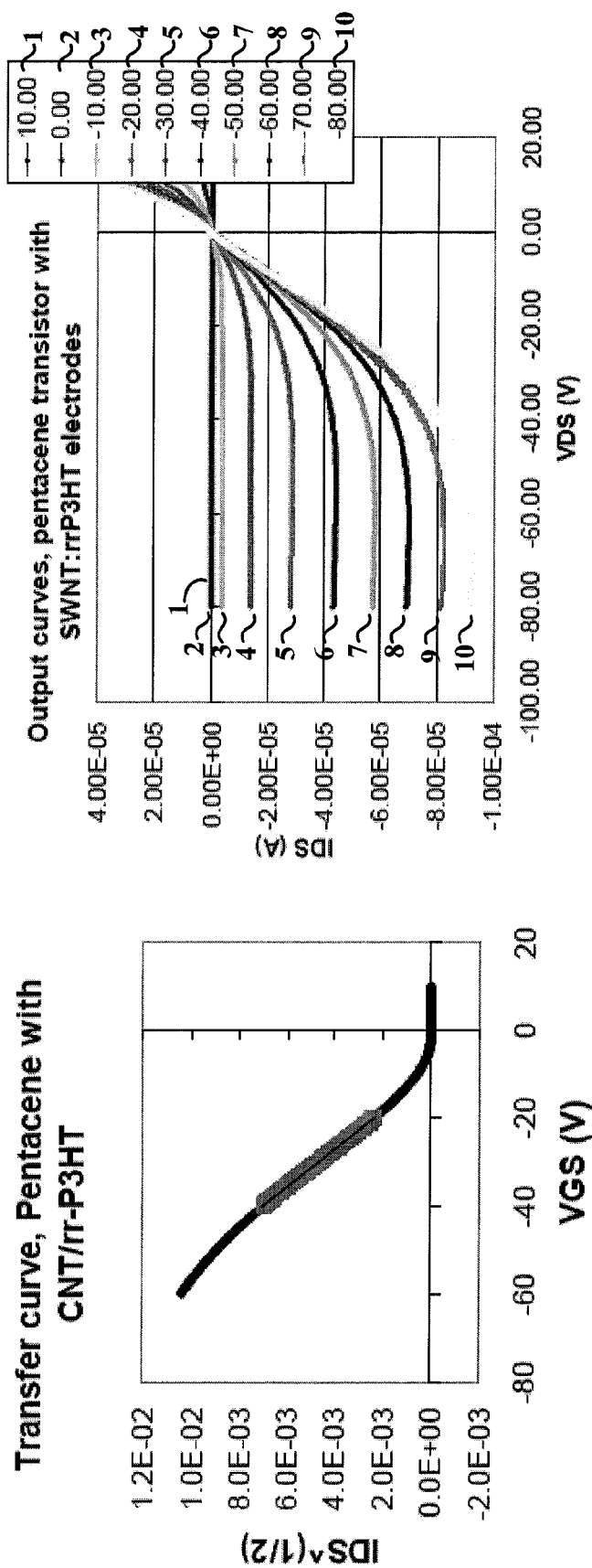
FIG. 9 shows a transfer plot for a transistor having a spin-coated nanotube electrode, according to another example embodiment.
FIG. 10 shows an output plot for transistors having a spin-coated nanotube electrode, according to another example embodiment.
Figure 12:
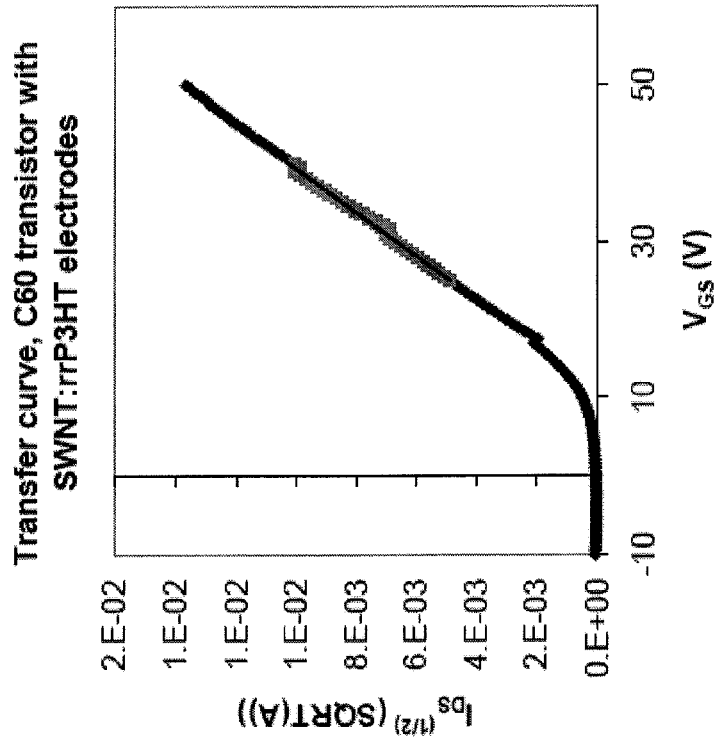
FIG. 12 shows an output plot for transistors having a spin-coated nanotube electrode, according to another example embodiment.
Figure 11:
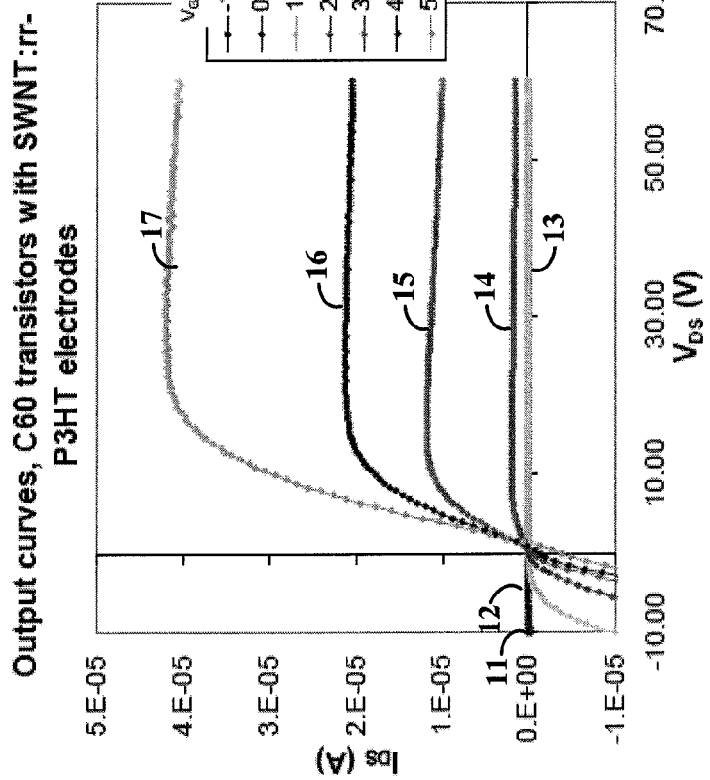
FIG. 11 shows a transfer plot for a transistor having a spin-coated nanotube electrode, according to another example embodiment.

FIGS. 9-12 show example transfer and output curves for transistors of pentacene and $C_{60}$ made from SWNT:rr-P3HT composites without metal, in accordance with various example embodiments. FIGS. 9 and 10 respectively show transfer and output curves for a SWNT/pentacene transistor. FIGS. 11 and 12 respectively show transfer and output curves for a SWNT/$C_{60}$ transistor.

In some embodiments, pentacene transistors as discussed herein are manufactured using a facile fabrication approach involving direct deposition with simultaneous patterning from solution onto a substrate. Carbon nanotubes in the underlying polymer:SWNT-deposited film contribute to charge injection, which may originate from a geometry-induced electric field enhancement at the tip of each carbon nanotube (e.g., and may narrow the barrier against tunneling injection into the pentacene).

The nanotubes in the polymer:SWNT-deposited films can be randomly oriented, pointed to a device channel, or alongside an interface, to suit various example embodiments. This orientation can be used to set, or enhance, the field enhancement effect. This orientation can also be used to control charge injection via selected pathways at which local geometry is amenable to the field enhancement effect.

In some embodiments, the morphology of $C_{60}$ grown on a nanotube network as discussed herein contributes to electrical performance (e.g., as shown in FIGS. 11-12), addressing work function differences between the SWNT network and the lowest unoccupied molecular orbital (LUMO) of the $C_{60}$ film. This morphology can also be used/set to mitigate parasitic resistance effects that can be present in devices such as $C_{60}$ bottom contact devices (e.g., via oxidation).

For additional discussion regarding nanotube-based electrodes, and for examples and applications as may be implemented with one or more embodiments as discussed herein, reference may be made to S. L. Hellstrom, H. W. Lee, Z. Bao, "Polymer-assisted direct deposition of uniform carbon nanotube bundle networks for high performance transparent electrodes", *ACS Nano*, 2009, 3 (6), pp 1423-1430, which is fully incorporated herein by reference. For example, various embodiments directed to the formation of nanotube networks exhibiting mitigated or small bundle size may be implemented in a manner consistent with the respective figures shown therein, to limit the bundle size of nanotubes visible (e.g., similar to that shown in FIGS. 2 and 3).

MORE DETAILED AND/OR EXPERIMENTAL-TYPE EMBODIMENTS

In accordance with a particular embodiment, arc-discharge nanotubes are dispersed in solution and applied to a substrate as follows. The nanotubes are purified to remove amorphous carbon and other contaminants, after which sonication power and time are limited to about 60 min or less and 180 W or less to minimize tube damage and cutting. Above an initial weight ratio of about 1:15 rr-P3HT:CNT in chloroform, 80-100 µg CNT/mL are dispersed in a solution (e.g., such that the solution appears uniform to the human eye). No appreciable difference in behavior is observed using rr-P3DT, except that an about minimal ratio required for dispersion increases to about 2:25, to achieve the aforesaid uniformity.

After subsequent treatment of networks in $SOCl_2$, sheet resistances of about 80 Ω/sq at 72% transmittance at 550 nm are obtained. This method can be extensible to using other soluble conjugated polymers such as poly[2-methoxy-5-(2'-ethylhexyloxy)-1,4-phenylene vinylene] (MEH-PPV). Other substrates including PET may also be used. Using 1:15 ratio P3HT composites spin-coated onto plastic substrates and the same procedures described earlier, some films performed similar to but slightly (a factor of 1.2) worse than those deposited on glass under similar conditions. The technique provides a readily implemented, reliable, scalable, plastics-compatible method for fabricating flexible transparent electrodes directly from solution onto the substrate of interest.

In some embodiments, nanotubes are purified as follows. About 80 mg of arc-discharge carbon nanotubes (e.g., grade ASP-100F from ILJIN Nanotech of Seoul, Korea) are mixed with 2 g of J. T. Baker sodium dodecyl sulfate (SDS, available from Mallinckrodt Baker of Phillipsburg, N.J.) and 200 mL of Invitrogen (Carlsbad, Calif.) 0.1 µm filtered ultrapure water. This mixture is placed in an ice water bath and sonicated in an ultrasonic cup-horn sonicator (e.g., available from Cole-Parmer of Vernon Hills, Ill.) for 30 min at 750 W. After sonication, the dispersion is centrifuged at 15,000 rpm for 4 hours at 4° C. in a centrifuge (e.g., a Sorvall RC5C Plus available from Thermo Scientific of Waltham, Mass.), and the supernatant decanted. The supernatant is diluted with anhydrous acetone, which dissociates the SDS from the nanotubes, and centrifuged to collect the precipitated tubes. This process of acetone rinsing followed by precipitate collection is repeated four times. Finally, the mixture is filtered through a Millipore 0.45 µm pore size PTFE membrane to collect the nanotubes. The tubes form a sheet on top of the filter, which is then peeled off and dried at 50° C. under vacuum overnight.

Composite solutions are prepared as follows, in accordance with one or more embodiments. One to 1.5 mg of SWNTs prepared during nanotube purification are dispersed in chloroform at a concentration of 100 µg/mL, by sonicating at 180 W for 30 min in an ice bath, using a Cole-Parmer ultrasonic cup-horn sonicator (discussed above). A few mg of rr-P3HT (e.g., from Sigma Aldrich of St. Louis, Mo.) is dissolved in 4 mL of chloroform under gentle heating and shaking. A relevant quantity of rr-P3HT is then added to 2 mL of the nanotube dispersion using a glass micro-liter syringe, and the mixture is again sonicated at 180 W for 30-60 min, until the suspension is uniform to the eye. The total volume of solution is then refreshed to 2 mL by adding additional chloroform.

The substrate is prepared and spin coated as follows, in connection with one or more embodiments. A 1.5 cm×1.5 cm cut display-grade TFT glass (e.g., Eagle glass by Corning of Corning, N.Y.) is cleaned by placing in chloroform and then in a Branson 3510 100 W/42 kHz ultrasonic cleaner (Branson Ultrasonics of Danbury, Conn.) for 10 min, then switching the solvent to ethanol and repeating. This is followed by drying the substrates under a nitrogen stream and placing them in a cleaner (e.g., a Model 42 UV-Ozone cleaner from Jelight of Irvine, Calif.) for 20 min. A substrate is set spinning at 7000 rpm, and the predetermined amount of solution is dropped, one drop at a time, onto the substrate using a glass pipette. After spin-coating, the back of the substrate is cleaned with methanol, and the sample is annealed at about 120° C. on a hot plate, soaked in chloroform for an additional 10 min, and dried to remove any accessible excess polymer.

Thionyl chloride treatment is carried out as follows, in connection with one or more example embodiments. After initial electrical measurements, samples are placed individually in glass vials face-up and thionyl chloride (Alfa Aesar of Ward Hill, Mass., 99+%) is introduced to the vial via glass pipette until the sample is fully immersed. Samples are left loosely covered for 12 h and then removed and carefully dried under a gentle nitrogen stream. Post-treatment electrical data are taken within 1 hour of treatment to mitigate instability of the doped films. In some implementations, the polymer is also doped, such as for application as high-polymer-content films, to set or improve electrical performance of the films.

Optical microscopy can be taken under a 50× objective with the substrate suspended to prevent the support from being visible through the glass. Atomic force microscopy can be taken using a Veeco (Santa Barbara, Calif.) Multimode SPM in tapping mode. Transmittances and optical spectra were measured by a Cary 6000i UV-vis-NIR spectrophotometer (Varian, Inc. of Palo Alto, Calif.). Micro-Raman measurements (LabRam Aramis, from Horiba Jobin Yvon of Edison, N.J.) are obtained at 633 nm excitation at 100× magnification and 1 μm spot size, and at least four spectra were obtained per sample. Gold electrodes of nominally 50 nm thickness as monitored by QCM were deposited via thermal evaporation (Angstrom Engineering, Inc. of Kitchener, Ontario, Canada) through a cut transparency film shadow mask, at a rate of 0.3-0.6 Å/s. The electrodes were in the form of line arrays with a 2 mm×2 mm central channel. Electrical measurements were taken using a Keithley (Cleveland, Ohio) 4200SCS semiconductor parameter analyzer and a standard probe station setup. After measuring, all sheet resistance values were multiplied by a factor of 2.5, which represents the average empirically determined effect of fringe electric field on this electrode geometry.

Various embodiments described above and shown in the figures may be implemented together and/or in other manners. One or more of the items depicted in the drawings/figures can also be implemented in a more separated or integrated manner, or removed and/or rendered as inoperable in certain cases, as is useful in accordance with particular applications. For example, embodiments involving the formation of carbon nanotubes as discussed above may be implemented using different/additional solvents and/or different polymer types or concentrations, and further by adjusting environmental conditions, modifying the surface of an underlying substrate, or post-treating the carbon nanotube networks. In view of the description herein, those skilled in the art will recognize that many changes may be made thereto without departing from the spirit and scope of the present invention.

What is claimed is:

1. A transparent electrode comprising:
a substrate;
on the substrate, a solution including a composite material having nanotubes and a conjugated polymer, the conjugated polymer being configured to disperse the nanotubes in the solution or to maintain the nanotubes dispersed in the solution, the nanotubes constituting a majority of the composite material by weight; and
in the solution, a network of carbon nanotubes that are arranged at electrode regions of the substrate for forming an electrode.

2. A transparent electrode comprising:
a substrate; and
on the substrate, a composite material having nanotubes and a conjugated polymer, the nanotubes constituting a majority of the composite material by weight, the conjugated polymer being configured to disperse the nanotubes in a solution or to maintain the nanotubes dispersed in the solution, the nanotubes being arranged in a dispersed network on the substrate to form an electrode.

3. The electrode of claim 1, wherein the carbon nanotube network is doped with a dopant that sets a conductivity characteristic of the carbon nanotubes.

4. The electrode of claim 1, wherein the polymer is doped with a conductive dopant.

5. The electrode of claim 1, further including dopants in both of the conjugated polymer and the nanotubes.

6. The electrode of claim 1, wherein the conjugated polymer is π-stacked on the nanotubes and configured and arranged to prevent aggregation of the nanotubes into intertwined bundles of nanotubes having a diameter greater than 100 nm.

7. The electrode of claim 1, wherein the carbon nanotubes constitute at least 50% of the solute in the solution by weight.

8. The electrode of claim 1, wherein the network of carbon nanotubes includes a plurality of nanotube bundles having a cross-section of between about 40 nm and 100 nm.

9. The electrode of claim 1, wherein the substrate includes target regions that are selective to the composite material, and the carbon nanotubes are arranged at the target regions.

10. The electrode of claim 1, wherein the substrate includes target regions that are selective to the composite material, different ones of the target regions being configured and arranged to control a nanotube density and feature resolution at the target region that is different than nanotube density and feature resolution at another one of the target regions.

11. The electrode of claim 2, wherein the nanotubes are doped with a dopant that sets a conductivity characteristic of the nanotubes.

12. The electrode of claim 2, wherein the polymer is doped with a conductive dopant.

13. The electrode of claim 2, further including dopants in the conjugated polymer and the nanotubes.

14. The electrode of claim 2, wherein the conjugated polymer is π-stacked on the nanotubes and configured and arranged to prevent aggregation of the nanotubes into intertwined bundles of nanotubes having a diameter greater than 100 nm.

15. The electrode of claim 2, wherein the nanotubes include a plurality of bundles having a cross-section of between about 40 nm and 100 nm.

16. The electrode of claim 2, wherein the substrate includes target regions that are selective to the composite material, and the nanotubes are arranged at the target regions.

17. The electrode of claim 2, wherein the substrate includes target regions that are selective to the composite material, different ones of the target regions being configured and arranged to control a nanotube density and feature resolution at the target region that is different than nanotube density and feature resolution at another one of the target regions.

* * * * *